(12) United States Patent
Chuang et al.

(10) Patent No.: US 6,987,064 B2
(45) Date of Patent: Jan. 17, 2006

(54) METHOD AND COMPOSITION TO IMPROVE A NITRIDE/OXIDE WET ETCHING SELECTIVITY

(75) Inventors: Ping Chuang, Taichung (TW); Huxley Lee, Hsin Chu (TW); Henry Lo, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 469 days.

(21) Appl. No.: 10/274,603

(22) Filed: Oct. 21, 2002

(65) Prior Publication Data

US 2004/0077171 A1 Apr. 22, 2004

(51) Int. Cl.
*H01L 21/302* (2006.01)
*H01L 21/461* (2006.01)

(52) U.S. Cl. .................. 438/692; 438/745; 438/757

(58) Field of Classification Search ......... 438/691–693, 438/745, 757
See application file for complete search history.

(56) References Cited

U.S. PATENT DOCUMENTS

| | | | | |
|---|---|---|---|---|
| 5,470,421 A | * | 11/1995 | Nakada et al. | 438/757 |
| 5,658,811 A | * | 8/1997 | Kimura et al. | 438/289 |
| 5,786,276 A | * | 7/1998 | Brooks et al. | 438/724 |
| 6,001,215 A | * | 12/1999 | Ban | 156/345.15 |

* cited by examiner

*Primary Examiner*—Duy-Vu N. Deo
(74) *Attorney, Agent, or Firm*—Tung & Associates

(57) ABSTRACT

A method for wet etching a metal nitride containing layer overlying a silicon oxide containing layer in a semiconductor device or micro-electro-mechanical device manufacturing process including providing a substrate including a silicon oxide containing layer and an overlying exposed metal nitride containing layer; providing a wet etching solution including phosphoric acid and water; adding a silicon containing compound which undergoes a hydrolysis reaction in the wet etching solution; and, contacting the exposed metal nitride containing layer with the wet etching solution for a period of time to remove the metal nitride containing layer.

16 Claims, 1 Drawing Sheet

METHOD AND COMPOSITION TO IMPROVE A NITRIDE/OXIDE WET ETCHING SELECTIVITY

FIELD OF THE INVENTION

This invention generally relates to integrated circuit micro-fabrication processes and more particularly to a method and composition for reducing an etching rate of $SiO_2$ to improve a wet etching selectivity, for example silicon nitride (e.g., $Si_3N_4$) etching rate compared to a $SiO_2$ etching rate to improve a process flow in an integrated circuit micro-fabrication process.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semi-conductor devices, improper electrical isolation among devices will cause current leakage, for example junction leakage, consuming a significant amount of power as well as compromising device functionality. Among some examples of reduced functionality include latch-up, which can damage the circuit temporarily, or permanently, noise margin degradation, voltage threshold shift and cross-talk.

Shallow trench isolation (STI), is a preferred electrical isolation technique especially for a semiconductor chip with high integration. STI structures generally involves filling trenches etched into a semiconducting substrate, for example silicon, with a chemical vapor deposition (CVD) silicon oxide ($SiO_2$) which is then planarized by a chemical mechanical polishing (CMP) process which stops on a layer of silicon nitride (e.g., $Si_3N_4$) to yield a planar surface.

Shallow trench isolation features with trenches having submicrometer dimensions are effective in preventing latch-up and punch-through phenomena. Broadly speaking, conventional methods of producing a shallow trench isolation feature include: forming a hard mask, for example silicon nitride, over the targeted trench layer, for example including a thermally grown pad oxide layer, patterning a photoresist over the hard mask to define a trench feature, anisotropically etching the hard mask to form a patterned hard mask, and thereafter anisotropically etching the trench feature to form the shallow trench isolation feature. Subsequently, the photoresist is removed (e.g., stripped) and the shallow trench isolation feature is back-filled, with a dielectric material, for example a CVD silicon dioxide, also referred to as STI oxide, followed by thermal treatment and CMP planarization to remove excess STI oxide above the silicon nitride (hardmask) level. Subsequently, the silicon nitride hardmask layer is removed according to a wet etching process using phosphoric acid.

One problem with prior art wet etching processes using phosphoric acid to remove the silicon nitride layer is that the selectivity of silicon nitride to an underlying pad oxide, for example a thermally grown layer of $SiO_2$, is not sufficiently high for manufacturing modern semiconductor devices, for example logic devices using 0.13 micron technologies and smaller, for example 0.1 micron technologies. For example, during the wet etching of the silicon nitride layer, the underlying pad oxide layer is etched to some degree by the phosphoric acid, making the thickness of the pad oxide non-uniform across a process wafer surface. As a result, it has been necessary to remove the remaining pad oxide layer according to a second wet etching process using, for example, hydrofluoric (HF) acid and thermally re-growing another $SiO_2$ layer over the silicon substrate to accommodate subsequent processes.

A problem with etching the pad oxide layer is that frequently, the HF etching solution attacks the STI oxide, for example at the STI trench corners where a thermally grown $SiO_2$ oxide has been grown to line the STI trenches. As a result etching divots at the trench corners where high electrical fields are present during device operation causing device degradation including junction leakage and reverse short channel effects. Another drawback of removing the pad oxide is that a subsequent $SiO_2$ layer, also referred to as a sacrificial oxide must be regrown over the silicon substrate in order to protect the silicon surface and to modify subsequent ion implantation steps forming doped regions in the silicon substrate. For example, during a series of subsequent ion implant processes, ions are implanted at a predetermined distance below the silicon substrate surface and with a predetermined doping profile forming, for example, a retrograde profile. The series of ion implants includes, for example, a voltage threshold adjustment implant and a punch through implant. A uniform layer of $SiO_2$, at the silicon substrate surface is critical for achieving consistent doping profiles and for preventing the phenomenon of ion channeling which adversely affects doping profiles.

There is therefore a need in the semiconductor processing art to develop an improved wet etching composition and method having improved selectivity for etching a metal nitride containing layer overlying a silicon oxide silicon oxide containing layer to avoid or reduce overetching of the silicon oxide layer to improve semiconductor device performance and reliability while improving a device manufacturing process flow.

It is therefore an object of the invention to provide develop an improved wet etching method having improved selectivity for etching a metal nitride containing layer overlying a silicon oxide containing layer to avoid or reduce overetching of the silicon oxide layer to improve semiconductor device performance and reliability while improving a device manufacturing process flow in addition to overcoming other shortcomings in the prior art.

SUMMARY OF THE INVENTION

To achieve the foregoing and other objects, and in accordance with the purposes of the present invention, as embodied and broadly described herein, the present invention provides a method and composition for wet etching a metal nitride containing layer overlying a silicon oxide containing layer in a semiconductor device or micro-electro-mechanical device manufacturing process.

In a first embodiment, the method includes providing a substrate including a silicon oxide containing layer and an overlying exposed metal nitride containing layer; providing a wet etching solution including phosphoric acid and water; adding a silicon containing compound which undergoes a hydrolysis reaction in the wet etching solution; and, contacting the exposed metal nitride containing layer with the wet etching solution for a period of time to remove the metal nitride containing layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
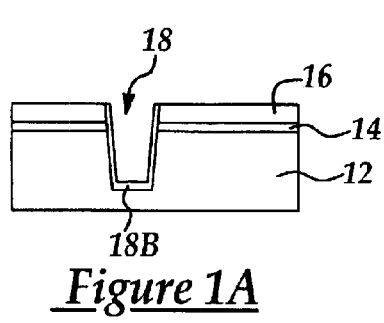
FIGS. 1A–1D are conceptual cross sectional side views of a portion of a shallow trench isolation (STI) region showing manufacturing stages of STI regions formed according to embodiments of the present invention.

The method and composition of the present invention is explained with respect to processing steps included in forming a shallow trench isolation (STI) feature, for example in wet etching a silicon nitride (e.g., $Si_3N_4$) layer overlying a $SiO_2$ layer. However, it will be appreciated that the method and composition of the present invention may be advantageously used in the wet etching of any metal nitride containing dielectric layer overlaying an $SiO_2$ containing layer where an etching selectivity of the overlying dielectric layer with respect to the underlying $SiO_2$ layer is controllably varied to increase the etching selectivity by addition of a silicon containing compound that undergoes hydrolysis in the wet etching solution, for example a silicon halide, to an acidic wet etching solution, for example, including phosphoric acid ($H_3PO_4$). The particular benefits realized with respect to the exemplary implementation of the present invention in the formation of an STI structure followed by ion implantation steps include the reduction of wet etching induced defects to the $SiO_2$ layer, for example, a pad oxide layer, thereby improving device performance and avoiding the necessity of stripping the pad oxide $SiO_2$ layer and reforming a sacrificial $SiO_2$ layer over a silicon substrate prior to ion implantation. However, it will be appreciated that the benefits of the present invention realized by controllably altering a selectivity of a wet etching composition used in a wet etching process of an overlying metal nitride containing dielectric layer with respect to an underlying $SiO_2$ containing layer has numerous benefits in connection with other integrated circuit or micro-electro-mechanical (MEM) manufacturing processes where a controllably selective acidic wet etching process is advantageously applied.

In one embodiment of the present invention, a substrate is provided including an exposed metal nitride containing dielectric layer overlying an $SiO_2$ containing layer. A wet etching process including an acidic wet etching solution for wet etching the metal nitride containing dielectric layer is then carried out including adding a selected amount of a silicon containing compound that undergoes hydrolysis in the acidic wet etching solution to increases an etching rate of the metal nitride containing dielectric layer compared to an etching rate of the $SiO_2$ containing layer to minimize $SiO_2$ etching.

In one embodiment, the silicon containing compound comprises a silicon halide including one or more of $SiCl_4$, $SiF_4$, $SiBr_4$, and the like.

In another embodiment, the acidic wet etching solution includes phosphoric acid.

Referring to FIGS. 1A–1D, in an exemplary implementation of the present invention, cross sectional side views of a portion of a semiconductor wafer show an integrated circuit manufacturing process in stages of shallow trench isolation (STI) feature manufacture including adjacent active areas for forming 0.13 micron logic features and smaller, for example, about 0.1 micron features.

Referring to FIG. 1A is shown a silicon substrate 12, for example a single crystalline p-doped silicon substrate or a p-epi-on p+ substrate as is known in the art. Overlying the silicon substrate 12 is a thermally grown $SiO_2$ layer 14, also referred to as a pad oxide layer formed over the silicon substrate, for example semiconductor wafer, surface. The pad oxide layer 14 is preferably grown by a conventional thermal oxidation process, to a thickness of about 50 Angstroms to about 150 Angstroms. For example, the pad oxide layer 14 is grown in rapid thermal oxidation process (RTO) or in a conventional annealing process including oxygen at a temperature of about 800° C. to about 1150° C.

Formed over the pad oxide layer 14 is a hardmask metal nitride layer 16, for example silicon nitride (e.g., $Si_3N_4$). It will be appreciated that other metal nitrides, for example, silicon oxynitride (e.g., SiON) may be used in place of, or added overlying the silicon nitride layer. The hardmask layer 16 is deposited according to a conventional CVD process, for example, a low pressure CVD (LPCVD) process. For example, the metal nitride hard mask layer 16 is formed to have a thickness of between about 800 Angstroms and 1500 Angstroms.

Still referring to FIG. 1A, following formation of the hardmask layer 16, the hardmask layer is photolithographically patterned and etched (not shown) to form a hard mask pattern for etching and STI trench in the silicon substrate 12. Following dry etching of the hardmask layer 16 an STI trench e.g., 18 is anisotropically etched into the silicon substrate surrounding active areas of the semiconductor device. For example, a conventional reactive ion etching (RIE) process is used to anisotropically etch through the hardmask layer 16, the pad oxide layer 14, and followed by another conventional RIE process to etch through a portion of a thickness of the silicon substrate to form trench openings having a depth of, for example, between about 1,500 Angstroms and 5000 Angstroms. Preferably, the STI trench features are etched having sloped trench sidewalls, for example having an angle between about 70° and 90° (not shown) with top and bottom rounded corners (not shown) to minimize stress and improve device performance.

Still referring to FIG. 1A, following formation of the STI trench, 18, an $SiO_2$ (oxide) trench liner e.g., 18B is thermally grown over the silicon substrate 12 by a conventional thermal oxidation process to a thickness of about 50 to about 150 Angstroms in thickness to line the STI trench 18. Optionally, a thin layer of silicon nitride or silicon oxynitride, may be blanket deposited over the oxide trench liner to form a double trench liner (not shown) prior to backfilling the STI trench with CVD oxide, also referred to as STI oxide. The silicon nitride layer serves to relieve stresses induced in the oxide trench liner.

Figure 1B:
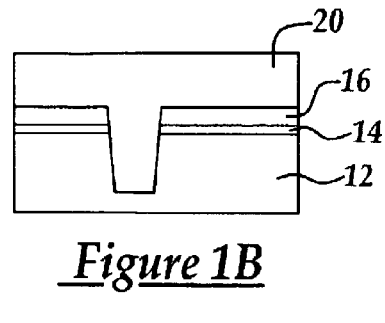

Referring to FIG. 1B, following formation of the oxide trench liner 18B (not shown in FIG. 1B) a CVD process including, for example, a PECVD or an HDP-CVD process is carried out to blanket deposit $SiO_2$ layer 20, also referred to as an STI oxide, to fill the STI trench 18 including covering the silicon nitride layer 16. For example, the STI oxide is deposited to a thickness of between about 3000 and about 9000 Angstroms. Following deposition of the STI oxide layer 20, a conventional annealing process, for example a conventional rapid thermal annealing (RTA) process is optionally carried out, for example at temperatures from about 800–1150° C. to improve the oxide quality.

Figure 1C:
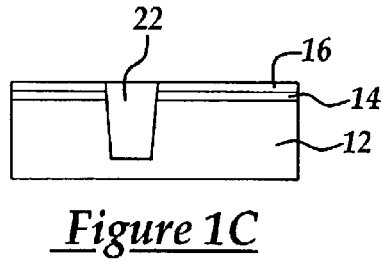

Referring to FIG. 1C, an oxide CMP process is carried out to remove the STI oxide layer 20 overlying the hardmask layer 16 to define an STI oxide backfilled STI trench 22. The hardmask layer 16 also serves as a CMP polish stop where the CMP process stops on the hardmask layer 16 including removing a portion of the hardmask layer 16.

Figure 1D:
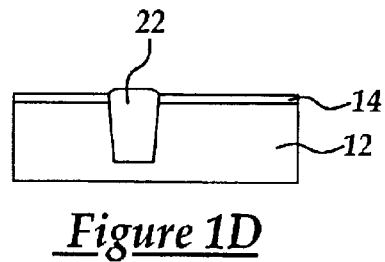

Referring to FIG. 1D, following the oxide CMP process the hardmask layer 16 is removed by a wet etching process according to an aspect of the present invention to leave a portion of the pad oxide layer 14 having a thickness greater than about 60 Angstroms. The wet etching process preferably includes contacting the hardmask layer with a wet etching solution, for example, a dipping process where the process wafer is dipped into one or more wet etching baths of a phosphoric acid wet etching solution heated from about 150° C. to about 175° C., more preferably about 165° C., for a period of about 40 minutes to about 70 minutes, followed by dipping in one or more deionized water baths. According to one embodiment of the invention, a silicon halide, for example silicon chloride ($SiCl_4$) is added to the phosphoric acid wet etching solution at a concentration of about 50 ppm to about 200 ppm (parts per million by weight), more preferably about 150 ppm to 200 ppm with respect to the phosphoric acid wet etching solution weight. For example, the silicon chloride is added prior to or following heating the phosphoric acid solution or following heating to improve solubility of the silicon halide in the wet etching solution. The phosphoric acid wet etching solution preferably includes about 80 percent by weight to about 90 percent by weight phosphoric acid ($H_3PO_4$) in water with respect to the phosphoric acid wet etching solution weight, more preferably about 86 percent by weight.

According to an embodiment of the present invention, in operation, the addition of a silicon halide to the phosphoric acid wet etching solution causes the silicon halide to undergo hydrolysis and acts to reduce the etching rate of the underlying pad oxide ($SiO_2$) layer 14 while maintaining about the same etching rate for the metal nitride layer, for example, silicon nitride layer 16, thereby increasing a wet etching selectivity of silicon nitride (e.g., $Si_3N_4$) etching with respect to the pad oxide ($SiO_2$).

Figure 2A:
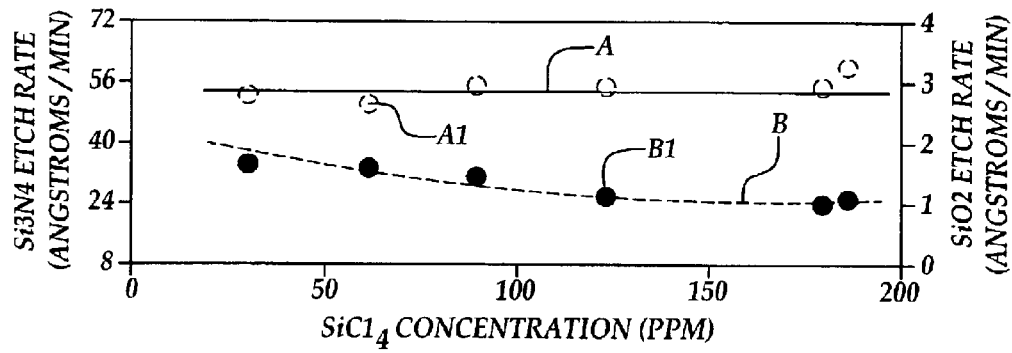
FIG. 2A is a graph of data showing the variation in wet etching rates for a silicon nitride layer and a silicon oxide layer according to an exemplary application using a wet etching composition according to embodiments of the present invention.

For example, referring to FIG. 2A is shown a graph showing an etching rate of $Si_3N_4$ (e.g., hardmask layer) on the left vertical axis and an etching rate of $SiO_2$ (e.g., pad oxide layer) on the right vertical axis. The horizontal axis represents the concentration of $SiCl_4$ in parts per million by weight (ppm) added to an 86 percent by weight $H_3PO_4$ in water etching solution. The etching process was carried with the etching solution heated to about 165° C. Line A intersects a series of data points e.g., A1 representing etching rates of $Si_3N_4$ (e.g., hardmask layer) while line B intersects a series of data points e.g., B1 representing etching rates of $SiO_2$ (e.g., pad oxide layer). It can be seen that the etching rate of $Si_3N_4$ remains about constant with an increased concentration of $SiCl_4$ added to the wet etching solution, while the etching rate of $SiO_2$ is reduced at increased concentrations of $SiCl_4$ with the most reduced etching rates being in the range of about 150 ppm to about 200 ppm $SiCl_4$.

Figure 2B:
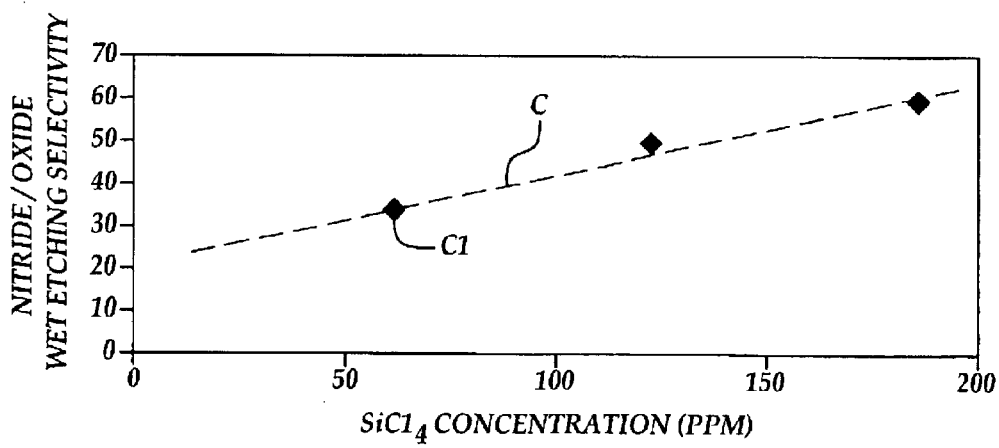
FIG. 2B is a graph of data showing the variation in wet etching selectivity for a silicon nitride layer and a silicon oxide layer according to an exemplary application using a wet etching composition according to embodiments of the present invention.

By reducing the etching rate of the $SiO_2$ layer with respect to the silicon nitride layer the etching selectivity of the silicon nitride layer with respect to the $SiO_2$ layer is increased. For example, referring to FIG. 2B is shown a graph that indicates silicon nitride etching selectivity with respect to silicon oxide selectivity on the vertical axis as a function of $SiCl_4$ concentration added to the phosphoric acid wet etching solution represented on the horizontal axis. Line C intersecting data points e.g., C1, indicates the nitride/oxide selectivity as an increasing function of $SiCl_4$ concentration present in the phosphoric acid wet etching solution. It can be seen that the nitride/oxide selectivity can be controllably altered or tuned over a wide range of nitride/oxide wet etching selectivity. According to prior art wet etching processes using a heated phosphoric acid etching solution the nitride/oxide selectivity is limited to about 30. According to an embodiment of the present invention, the nitride/oxide selectivity can be increased over a range of about 30 to about 60 by controllably adding $SiCl_4$ from about 50 ppm to about 200 ppm, more preferably about 150 ppm to about 200 ppm.

It will be appreciated that the method of the present invention may be advantageously used with respect to the wet etching of other metal nitride containing layers, including refractory metal nitrides, for example, titanium nitride, tantalum nitride and tungsten nitride overlying a silicon oxide containing layer to increase a nitride/oxide wet etching selectivity to minimize etching of the underlying oxide layer. While the precise reason for a decrease in the etching rate of $SiO_2$ by addition of silicon halides which undergo hydrolysis in the wet etching solution is not fully understood, it is believed to be related to complex chemical kinetics where the dissolution rate of silicon oxide is reduced due to slowing the rate of silicon oxide hydrolysis.

As a result of using the wet etching solution according to an exemplary application in an STI formation process, wet etching of the pad oxide layer is reduced and minimized during the wet etching of the silicon nitride layer where a nitride/oxide selectivity is increased. As a result of the increased wet etching selectivity, the remaining portion of the pad oxide layer may be left in place, thereby avoiding a subsequent hydrofluoric acid (HF) wet etching process to remove the pad oxide. It has been found that wet etching the silicon nitride layer using the set etching solution according to preferred embodiments leaves a substantially uniform pad oxide layer with a pad oxide thickness of greater than about 60 Angstroms, thereby avoiding the processing steps of stripping the pad oxide followed by re-growth of a sacrificial $SiO_2$ layer to modify subsequent ion implantation processes such as a voltage threshold adjustment ion plantation.

For example, it has been found necessary in the prior art to strip the pad oxide layer with HF and to re-form a thermally grown sacrificial oxide layer to protect the silicon substrate and reduce ion channeling in subsequent ion implantation processes. Uniform thickness of the sacrificial oxide layer is critical to controlling ion implantation profiles. The present invention of wet etching with preferred embodiments of the wet etching solution leaves the pad oxide in place at a uniform thickness thereby avoiding previously necessary processing steps. In addition, divot formation by HF attack at STI trench corners to degrade device performance is avoided as well by avoiding the HF pad oxide wet etching step. Moreover, it has been found that using the wet etching solution according to preferred embodiments increases the repeatability of achieving a given pad oxide layer thickness with uniform thickness across the process wafer surface. Thus, the method of the present invention advantageously improves device reliability and reduces the number of required process steps in integrated circuit manufacturing, for example in manufacturing logic devices including 0.13 micron technology and smaller, for example 0.1 micron technology.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for wet etching a nitride containing layer overlying a silicon oxide containing layer in a semiconductor device or micro-electro-mechanical device manufacturing process comprising the steps of:
    providing a substrate comprising a silicon oxide containing layer and an overlying exposed nitride containing layer;
    providing a wet etching solution comprising phosphoric acid and water;
    adding a silicon containing compound which undergoes a hydrolysis reaction in the wet etching solution; and,
    contacting the exposed nitride containing layer with the wet etching solution for a period of time to remove the nitride containing layer.

2. The method of claim 1, wherein an etching rate of the nitride containing layer compared to an etching rate of the silicon oxide containing layer is greater by about a factor of 30.

3. The method of claim 1, wherein the silicon containing compound is selected from the group consisting of silicon chloride ($SiCl_4$), silicon fluoride ($SiF_4$), and silicon bromide ($SiBr_4$).

4. The method of claim 1, wherein the nitride containing layer comprise a nitride selected from the group consisting of silicon nitride and refractory metal nitrides.

5. The method of claim 1, wherein the silicon oxide containing layer comprises a thermally grown silicon dioxide ($SiO_2$) layer over a silicon substrate.

6. The method of claim 5, wherein the nitride containing layer comprises silicon nitride.

7. The method of claim 6, wherein the silicon containing compound comprises silicon chloride ($SiCl_4$).

8. The method of claim 7, wherein silicon chloride ($SiCl_4$) is added at a concentration of about 50 ppm to about 200 ppm by weight with respect to the wet etching solution weight.

9. The method of claim 8, wherein an etching rate ratio of the nitride containing layer compared to the silicon oxide containing layer is varied from about 30 to about 60.

10. A method for wet etching a silicon nitride layer overlying a pad oxide layer in a shallow trench isolation (STI) formation process comprising the steps of:
    providing a silicon semiconductor wafer having an overlying thermally grown silicon oxide layer and an overlying silicon nitride layer;
    forming an $SiO_2$ filled STI trench planarized by a chemical mechanical polishing (CMP) process to expose the silicon nitride layer;
    wet etching the silicon nitride layer with a wet etching solution comprising a silicon containing compound to expose the thermally grown $SiO_2$ layer; and,
    leaving the thermally grown $SiO_2$ layer in place to modify a subsequent ion implantation profile.

11. The method of claim 10, wherein the silicon containing compound undergoes hydrolysis in the wet etching solution.

12. The method of claim 11, wherein the wet etching solution further comprises phosphoric acid ($H_3PO_4$) and the silicon containing compound comprises a silicon halide.

13. The method of claim 12, wherein the silicon halide includes a member selected from the group of silicon chloride ($SiCl_4$), $SiCl_3H$, silicon fluoride ($SiF_4$), silicon bromide ($SiBr_4$), $SiCl_2H_2$, and $SiX_aH_b$.

14. The method of claim 13 wherein an etching rate of the silicon nitride layer compared to an etching rate of the thermally grown $SiO_2$ layer is greater by about a factor of 30 to about 60.

15. The method of claim 14, wherein the silicon halide concentration in the wet etching solution is varied over a range of about 50 ppm to about 200 ppm by weight with respect to the wet etching solution weight.

16. The method of claim 10, wherein the thermally grown $SiO_2$ layer has a thickness of greater than about 2000 Angstroms following the step of wet etching the silicon nitride layer.

* * * * *